United States Patent
Slabaugh et al.

(10) Patent No.: US 10,840,739 B2
(45) Date of Patent: Nov. 17, 2020

(54) WOUND HOUSINGS FOR ELECTRONIC DEVICES

(71) Applicant: Apple Inc., Cupertino, CA (US)

(72) Inventors: Scott W. Slabaugh, Gilroy, CA (US);
Kevin M. Kenney, San Jose, CA (US);
Michael B. Wittenberg, Sunnyvale, CA (US); Erik G. de Jong, San Francisco, CA (US); Christopher S. Graham, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 84 days.

(21) Appl. No.: 15/990,455

(22) Filed: May 25, 2018

(65) Prior Publication Data

US 2019/0363577 A1   Nov. 28, 2019

(51) Int. Cl.
| | |
|---|---|
| *G06F 1/16* | (2006.01) |
| *H05K 5/00* | (2006.01) |
| *H05K 7/00* | (2006.01) |
| *H02J 50/10* | (2016.01) |
| *H01F 38/14* | (2006.01) |
| *H02J 7/02* | (2016.01) |
| *H05K 5/02* | (2006.01) |
| *H04B 5/00* | (2006.01) |

(52) U.S. Cl.
CPC .............. *H02J 50/10* (2016.02); *H01F 38/14* (2013.01); *H02J 7/025* (2013.01); *H04B 5/0081* (2013.01); *H05K 5/0073* (2013.01); *H05K 5/0247* (2013.01)

(58) Field of Classification Search
CPC ........... H02J 50/10; H02J 7/025; H01F 38/14; H04B 5/0081; H04B 5/0075; G06F 1/1626; G06F 1/1633; G06F 1/163
See application file for complete search history.

(56) References Cited

U.S. PATENT DOCUMENTS

2016/0352149 A1* 12/2016 Jeong ...................... H02J 50/12

FOREIGN PATENT DOCUMENTS

| CN | 204425426 | 6/2015 |
|---|---|---|
| CN | 104768340 | 7/2015 |
| CN | 106790790 | 5/2017 |
| CN | 107623765 | 1/2018 |
| CN | 107646135 | 1/2018 |

OTHER PUBLICATIONS

China Application No. 201811134602.0, Office Action, dated May 27, 2020, 20 pages.

* cited by examiner

*Primary Examiner* — Anthony M Haughton
(74) *Attorney, Agent, or Firm* — Kilpatrick Townsend & Stockton LLP

(57) ABSTRACT

Embodiments describe a housing for an electronic device that includes a non-conductive filament wound around a least a first portion of a perimeter of the housing, and a conductive filament wound around a least a second portion of the perimeter of the housing. The non-conductive filament and the conductive filament are adhered together to form the housing.

26 Claims, 8 Drawing Sheets

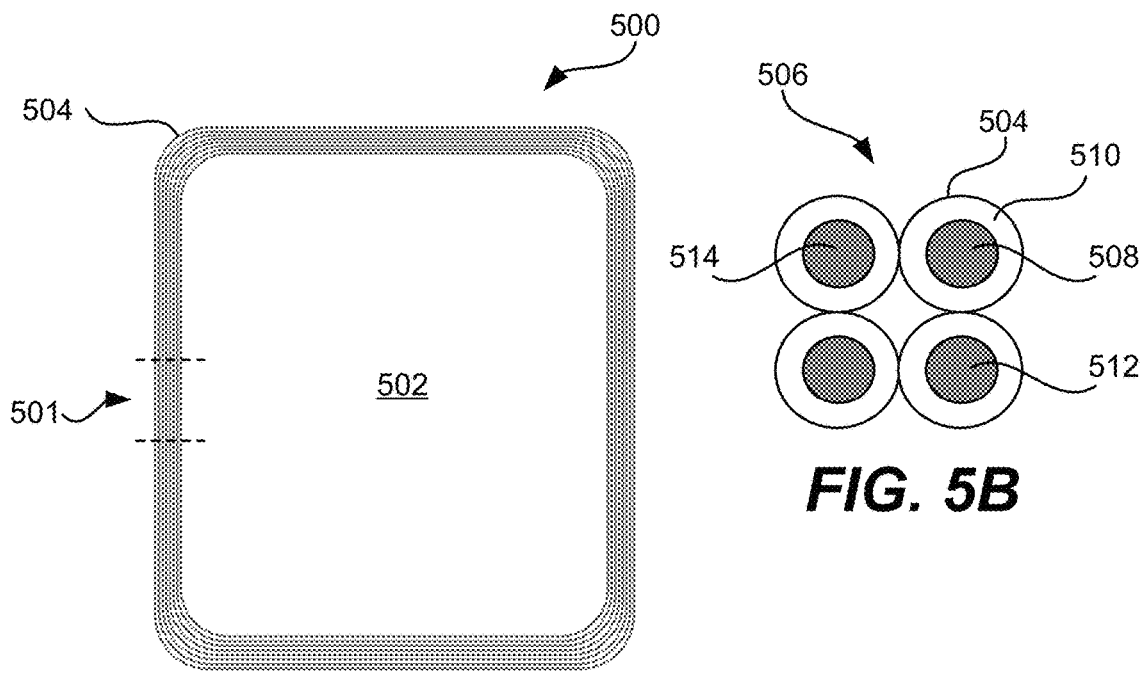
FIG. 5A
FIG. 5B
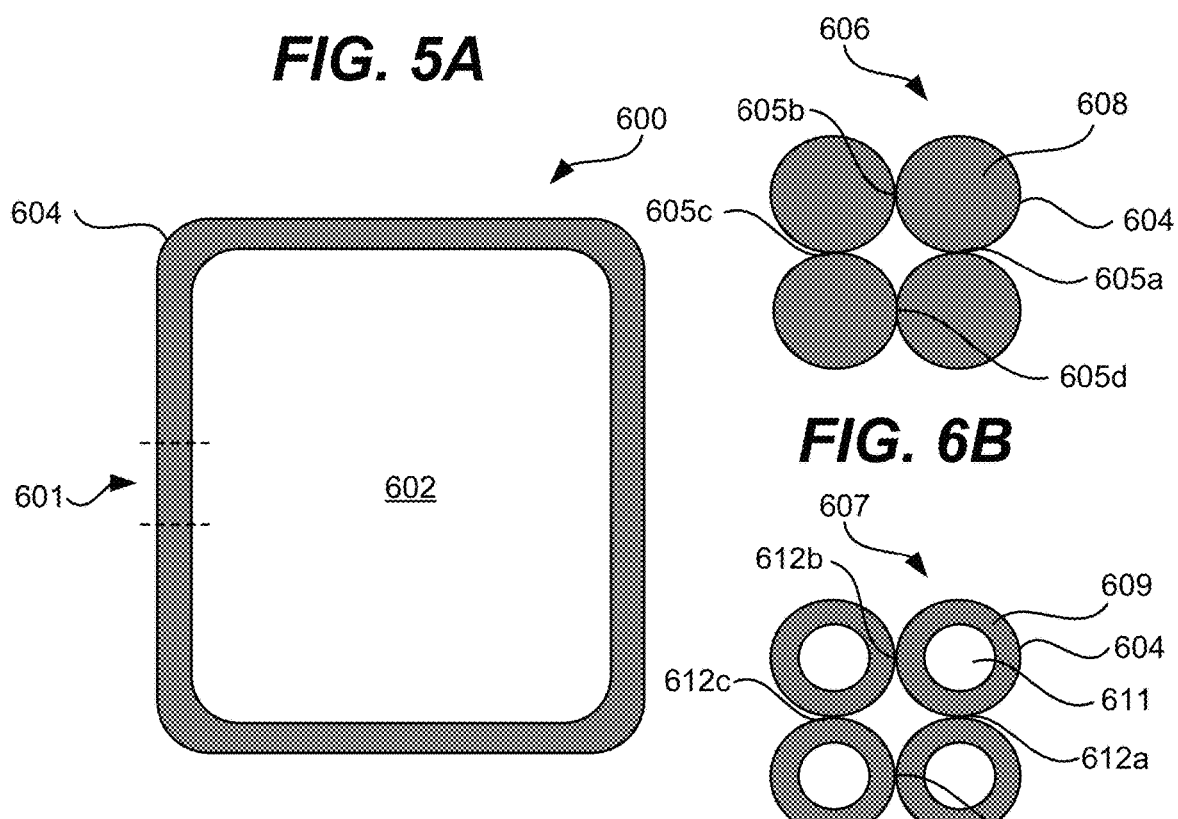
FIG. 6A
FIG. 6B
FIG. 6C

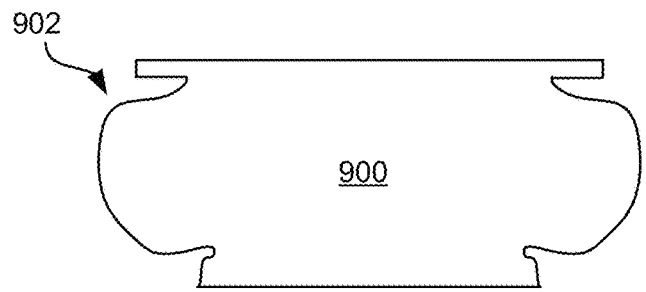
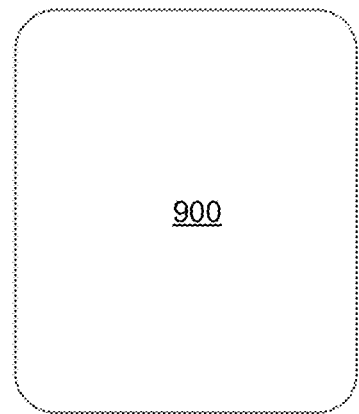
FIG. 9A  FIG. 9B
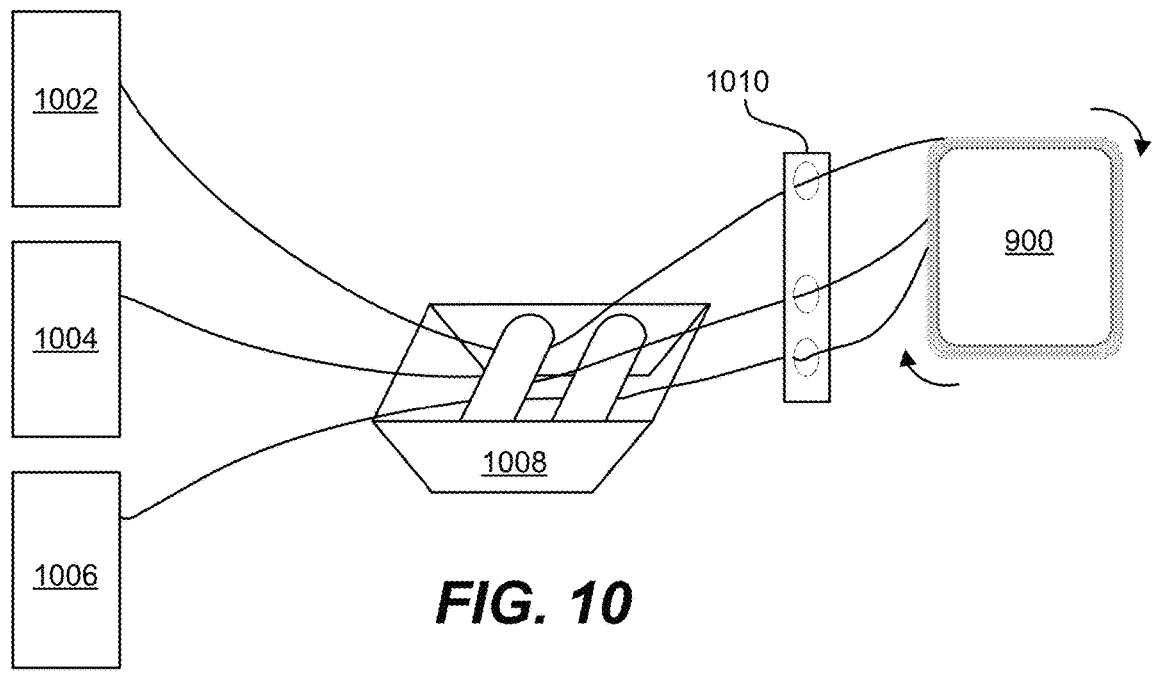
FIG. 10
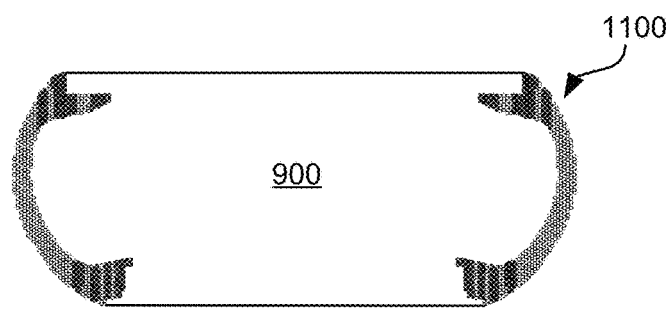
FIG. 11

WOUND HOUSINGS FOR ELECTRONIC DEVICES

BACKGROUND

Portable electronic devices, such as tablets, smart phones, smart watches, and the like, each typically include a housing that encloses and protects various delicate, internal electrical components. Conventionally, the housing itself merely functions as a protective case that has a rigid structure for protecting the internal components from damage. Portable electronic devices are often designed to be small and compact to enhance portability. This, however, often results in size constraints that can create limitations in product design, especially when an increasing number of electrical components need to fit within the housing for each subsequent generation of a product to meet demand for newer, more functionally advanced technology.

SUMMARY

Some embodiments of the disclosure provide a wound housing formed of one or more windings of conductive and non-conductive filament wound around a perimeter of the housing and adhered together to form a single structure. The wound housing can not only protect internal electrical components, but can also provide functionality typically provided by one or more of the internal electrical components. Providing additional functionality allows the wound housing to eliminate the need for certain internal electrical components, thereby enabling the device to be made smaller or enabling the portable electronic device to provide even more functionality.

In some embodiments, a housing for an electronic device includes a non-conductive filament wound around a least a first portion of a perimeter of the housing, and a conductive filament wound around a least a second portion of the perimeter of the housing, the non-conductive filament and the conductive filament are adhered together to form the housing.

The conductive filament can form an inductive coil configured to generate magnetic flux to wirelessly charge an external device or interact with magnetic flux to generate a current through the conductive filament. The conductive filament can include a conductive core and a non-conductive sleeve that electrically insulates conductive cores of adjacent turns from one another in the conductive filament. The conductive filament can form a single conductive body configured to generate and receive radio waves. The conductive filament can include a solid conductive wire. The conductive filament can include a non-conductive core surrounded by a conductive sleeve. The conductive filament can be directly adhered to the non-conductive filament. In some cases, the non-conductive filament can form a winding that extends from an outer surface to an inner surface of the housing. In some additional or alternative embodiments, the conductive filament forms a winding that extends from an outer surface to an inner surface of the housing. The conductive filament can be a first conductive filament and the housing further includes a second conductive filament wound around a least a third portion of the perimeter of the housing and adhered together with the first conductive filament and the non-conductive filament to form the housing. The first conductive filament and second conductive filament can be electrically isolated from one another by the non-conductive filament. The housing can further include a contact structure electrically coupled to the conductive filament and positioned on an inner surface of the housing, the contact structure can be formed of a plate of conductive material configured to make an electrical connection with an electrical component. The contact structure can be directly attached to the conductive filament or coupled to the conductive filament through a conductive trace. The conductive filament can extend into the housing past an inner surface to couple with an electronic component inside the housing.

In some embodiments, a portable electronic device includes a housing defining an interior cavity and formed from a plurality of filaments wound around a perimeter of the housing and adhered together to form the housing, the plurality of filaments including at least one non-conductive filament and at least one conductive filament that forms a first electronic component of the portable electronic device, and a second electronic component disposed within the interior cavity of the housing and electrically coupled to the first electronic component.

The second electronic component can be coupled to the first electronic component through a contact structure positioned on an inner surface of the housing.

In some embodiments, an electronic device includes an interconnection board comprising at least one contact structure, at least one electrical component mounted on the interconnection board and electrically coupled to the at least one contact structure, and a housing surrounding the interconnection board and the at least one electrical component. The housing includes a non-conductive filament wound around a least a first portion of a perimeter of the housing, and a conductive filament wound around a least a second portion of the perimeter of the housing, the non-conductive filament and the conductive filament are adhered together to form the housing.

The conductive filament can be electrically coupled to an electrical component of the at least one electrical component. The conductive filament can form an inductive coil configured to generate magnetic flux to wirelessly charge an external device or interact with magnetic flux to generate a current through the conductive filament. The conductive filament can form a single conductive body configured to generate and receive radio waves.

A better understanding of the nature and advantages of embodiments of the present invention may be gained with reference to the following detailed description and the accompanying drawings.

BRIEF DESCRIPTION OF THE DRAWINGS

FIG. 5A is a top-down view of an exemplary winding of conductive filament configured as an inductive coil, according to some embodiments of the present disclosure.

FIG. 5B is a cross-sectional view of a portion of a winding of conductive filament used to form an inductive coil, according to some embodiments of the present disclosure.

FIG. 6A is a top-down view of an exemplary winding of conductive filament configured as a conductive body, according to some embodiments of the present disclosure.

FIG. 6B is a cross-sectional view of a portion of winding of conductive filament used to form the conductive body that is constructed with a solid conductive filament, according to some embodiments of the present disclosure.

FIG. 6C is a cross-sectional view of an exemplary portion of another exemplary winding of conductive filament used to form the conductive body that is constructed with a filament including a conductive sleeve and an insulating core, according to some embodiments of the present disclosure.

FIG. 9A is a cross-sectional view of an exemplary mandrel used to form a wound housing, according to some embodiments of the present disclosure.

FIG. 9B is a top-down view of the mandrel shown in FIG. 9A, according to some embodiments of the present disclosure.

FIG. 10 is a simplified diagram illustrating an exemplary system for winding one or more conductive and non-conductive filament around a mandrel for forming a wound housing, according to some embodiments of the present disclosure.

FIG. 11 is a simplified diagram illustrating a mandrel after several windings of conductive and non-conductive filaments have wound around it for forming a wound housing, according to some embodiments of the present disclosure.

DETAILED DESCRIPTION OF THE INVENTION

Embodiments of the disclosure describe a wound housing for a portable electronic device. The wound housing can be formed of one or more windings of conductive and non-conductive filament wound around a perimeter of the housing and adhered together to form a single structure. In some embodiments, the windings of conductive filament can each form an electrical component that can perform one or more functions, thereby enabling the housing itself to perform more functions than just protecting the internal components of the portable electronic device. As an example, a winding of conductive filament can be constructed as an inductive coil to enable the wound housing to interact with magnetic flux to generate an electrical current that can charge an internal battery. In another example, the conductive filament can be constructed as an antenna to enable the wound housing to emit and receive radio waves. In some cases, a housing for a portable electronic device can have more than one winding of conductive filament, each configured to perform a different function, as will be discussed further herein.

I. Portable Electronic Device

Figure 1:
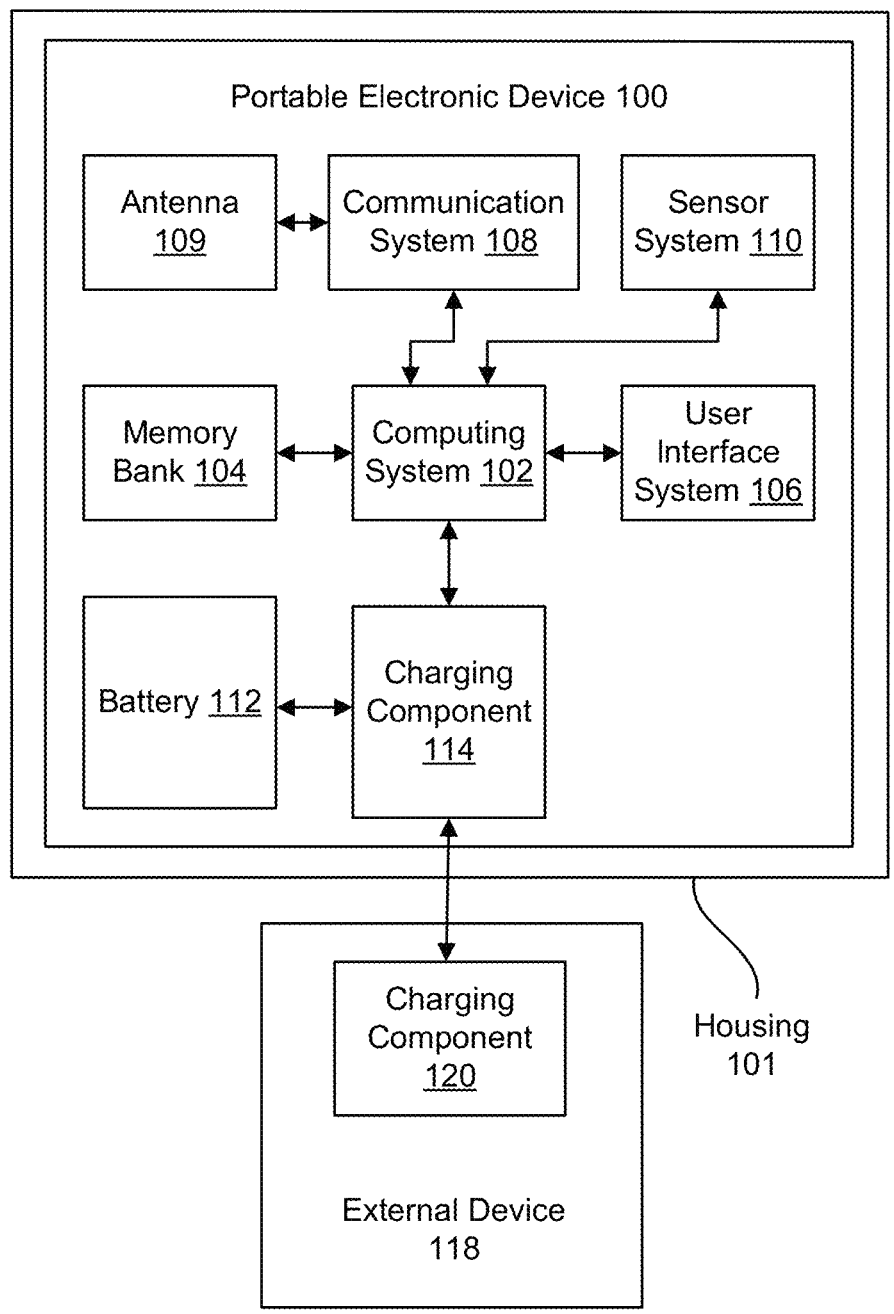
FIG. 1 is a block diagram illustrating a wireless charging system including an external device and a portable electronic device with a solid, protective housing.

A portable electronic device is an electronic device that can operate without being coupled to a power grid by running on its own locally stored electrical power. The portable electronic device can be specifically designed to perform various functions for a user. FIG. 1 is a block diagram illustrating an exemplary portable electronic device 100 and an exemplary external device 118 that can interact with portable electronic device 100. In some embodiments, electronic device 100 is a consumer electronic device that can perform one or more functions for a user. For instance, electronic device 100 can be a smart phone, wearable device, smart watch, tablet, personal computer, and the like.

Portable electronic device 100 and external device 118 can form a wireless charging system where portable electronic device 100 can receive and/or transmit power from/to external device 118. Device 100 includes a computing system 102 coupled to a memory bank 104. Computing system 102 can execute instructions stored in memory bank 104 for performing a plurality of functions for operating portable electronic device 100. Computing system 102 can be one or more suitable computing devices, such as microprocessors, computer processing units (CPUs), graphics processing units (GPUs), field programmable gate arrays (FPGAs), and the like.

Computing system 102 can also be coupled to a user interface system 106, a communication system 108, and a sensor system 110 for enabling electronic device 100 to perform one or more functions. For instance, user interface system 106 can include a display, speaker, microphone, actuator for enabling haptic feedback, and one or more input devices such as a button, switch, capacitive screen for enabling the display to be touch sensitive, and the like. Communication system 108 can include wireless telecommunication components, Bluetooth components, and/or wireless fidelity (WiFi) components for enabling device 100 to make phone calls, interact with wireless accessories, and access the Internet. As an example, communication system 108 can include one or more communication processors that can send and receive signals to and from antenna 109. In some cases, antenna 109 can be a single conductive body that can send and receive radio waves that propagate around portable electronic device 100. Sensor system 110 can include light sensors, accelerometers, gyroscopes, temperature sensors, and any other type of sensor that can measure a parameter of an external entity and/or environment.

All of these electrical components require a power source to operate. Accordingly, electronic device 100 also includes a battery 112 for discharging stored energy to power the electrical components of device 100. To replenish the energy discharged to power the electrical components, electronic device 100 includes a charging component 114. Typically, charging component 114 can be a socket configured to receive power from external device 118 when mated with charging component 120. Thus, external device 118 can be a charging device, such as an external wall outlet coupled to a utility grid or a connector for a portable external battery. In some instances, portable electronic device 100 can be configured to receive power wirelessly, in which case charging component 114 can be an inductive coil configured to receive power from charging component 120, which can also be an inductive coil that generates time-varying magnetic flux. During wireless power transfer, charging component 120 can generate time-varying magnetic flux that interacts with charging component 114 and induces a corresponding current in charging component 114. The generated current can be used to charge battery 112.

The various components discussed above of portable electronic device 100, e.g., computing system 102, memory bank 104, user interface system 106, communication system 108, antenna 109, sensor system 110, battery 112, and charging component 114 can be separate components that are housed within an internal cavity defined by a housing 101. Housing 101 can provide a structure that protects the internal components from damage, whether it be from drop events or from exposure to moisture in the environment. Housing 101 is typically formed by adhering more than one solid structures together, such as two shells. Each shell can be a solid structure that is formed of one monolithic piece of material, e.g., plastic, metal, aluminum, ceramic, and the like. Forming housing 101 as a solid structure allows housing 101 to have a stiff structure that can withstand physical forces. Typically, a housing formed with solid structures, such as housing 101, primarily functions as a protective structure requiring portable electronic device 100 to rely on the internal components to provide the various functionality enabled by electronic device 100.

II. Wound Housing

According to some embodiments of the present disclosure, a housing can be constructed as a wound housing so that it can provide functions in addition to providing protection for internal components. For instance, a wound housing can also provide the functionality of an inductive coil for receiving and transmitting wireless power and/or an antenna for receiving and transmitting signals through radio waves. An exemplary portable electronic device with such a housing is discussed further herein with respect to FIG. 2.

Figure 2:
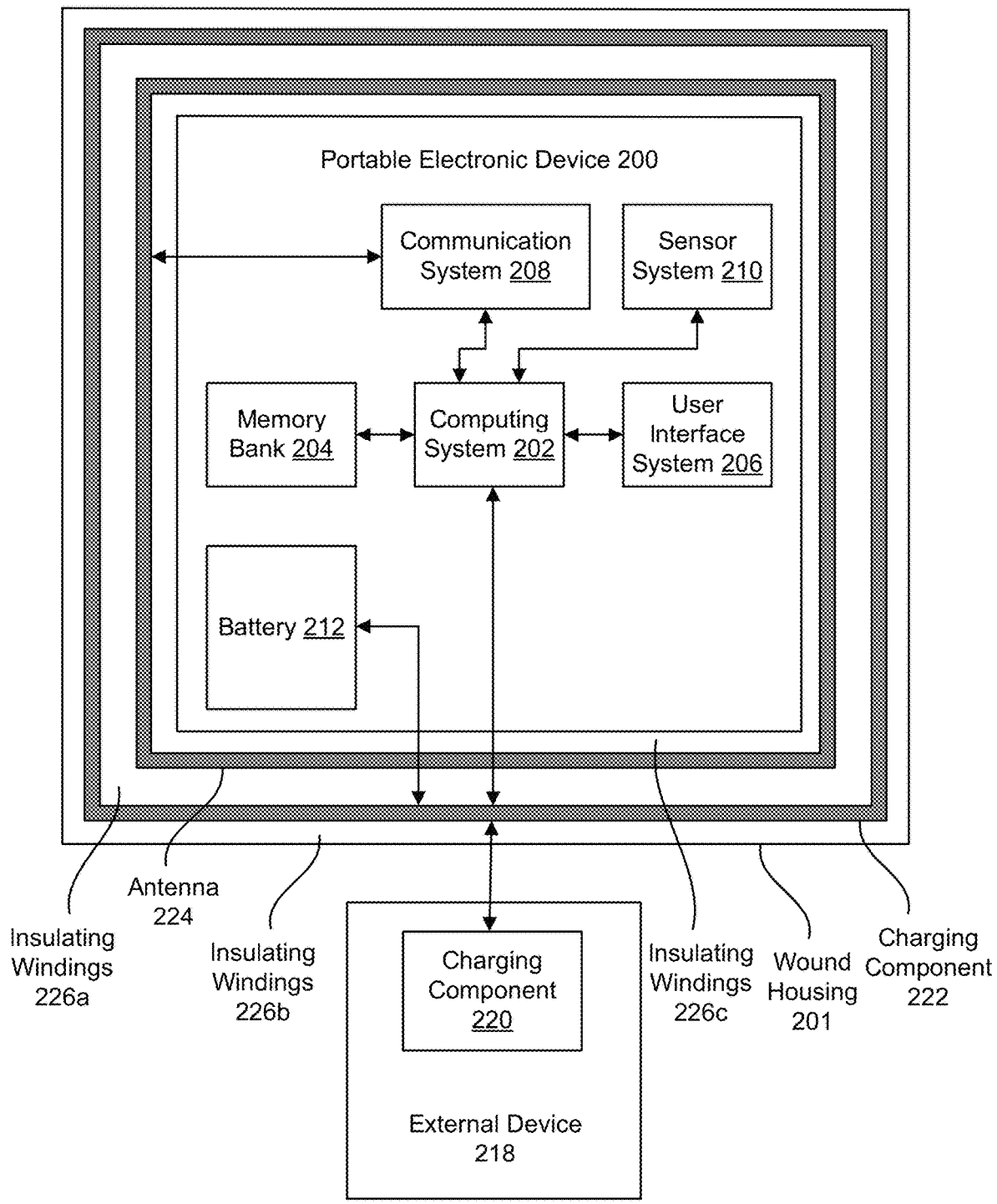
FIG. 2 is a block diagram illustrating an exemplary portable electronic device including a wound housing, according to some embodiments of the present disclosure.

FIG. 2 is a block diagram illustrating an exemplary portable electronic device 200 including a wound housing 201, according to some embodiments of the present disclosure. Like portable electronic device 100, portable electronic device 200 can include a plurality of internal components, e.g., computing system 202, memory bank 204, user interface system 206, communication system 208, sensor system 210, and battery 212. The internal components of portable electronic device 200 can be similar in construction and function to corresponding components in portable electronic device 100 discussed herein with respect to FIG. 1.

According to some embodiments, the internal components can be housed within wound housing 201. Like housing 101 in FIG. 1, wound housing 201 can provide protection for the internal components; however, unlike housing 101, wound housing 201 can also provide additional functionality. For instance, wound housing 201 can be constructed to include electrical components that enable wound housing 201 to transmit and receive wireless power, transmit and receive signals through radio waves, and any other similar type of functionality.

In some embodiments, wound housing 201 can be constructed to include a charging component 222 that exists as part of the construct of wound housing 201. Charging component 222 can be configured as an inductive coil formed from a winding of conductive filament having a plurality of turns to enable the transmitting and/or receiving of magnetic flux for wireless power transfer. In certain embodiments, the winding of conductive filament includes a conductive core insulated with a non-conductive sleeve that electrically isolates the outer surfaces of each turn of the conductive filament while allowing the cores to be electrically coupled together so that the resulting structure forms a coil of wire, as will be discussed in detail further herein. Computing system 202 and battery 212 can be coupled to charging component 222 so that wound housing 201 can wirelessly transfer power out of battery 212 to charge external device 218 and wirelessly receive power from external device 218 to charge battery 212 by way of charging component 222. Accordingly, a charging component does not need to be housed within wound housing 201.

In some additional or alternative embodiments, wound housing 201 can also be constructed to include an antenna 224 that exist as part of the construct of wound housing 201. Antenna 224 can be configured as a conductive body suitable for emitting and receiving radio waves through the atmosphere. The conductive body of antenna 224 can be formed of windings of conductive filament, where each turn is electrically coupled together through their outer surfaces so that all of the turns of the conductive filament form a single conductive body, as will be discussed further herein. Communication system 208 can be coupled to antenna 224 so that wound housing 201 can send radio wave signals out to, and receive radio wave signals from, a cell tower (not shown) by way of antenna 224. As such, an antenna 224 does not need to be housed within wound housing 201. By not having to house a charging component and/or an antenna within wound housing 201, portable electronic device 200 can be smaller in size or can have more space within wound housing 201 to include additional components for providing additional functionality than a housing that is not formed by windings of conductive and non-conductive filament.

Electrical components that are incorporated into wound housing 201, such as antenna 224 and charging component 222 shown in FIG. 2, can be physically and/or electrically isolated from one another to minimize cross-talk and electrical interference between the two components. Thus, in some embodiments, insulating windings 226*a-c* can also be incorporated within the structure of wound housing 201 to physically and/or electrically isolate electrical components formed by the windings of conductive filaments. For example, wound housing 201 can include insulating winding 226*a* positioned between antenna 224 and charging component 222 to physically and electrically isolate the two components. Furthermore, wound housing 201 can also include insulating windings 226*b-c* that are positioned outside of both electrical components (antenna 224 and charging component 222) to physically and electrically isolate the electrical components from the environment and/or other internal components within wound housing 201. Insulating windings 226*a-c* can be formed of non-conductive filament that wind along a perimeter of portable electronic device 200, as will be discussed in detail further herein.

Figure 3:
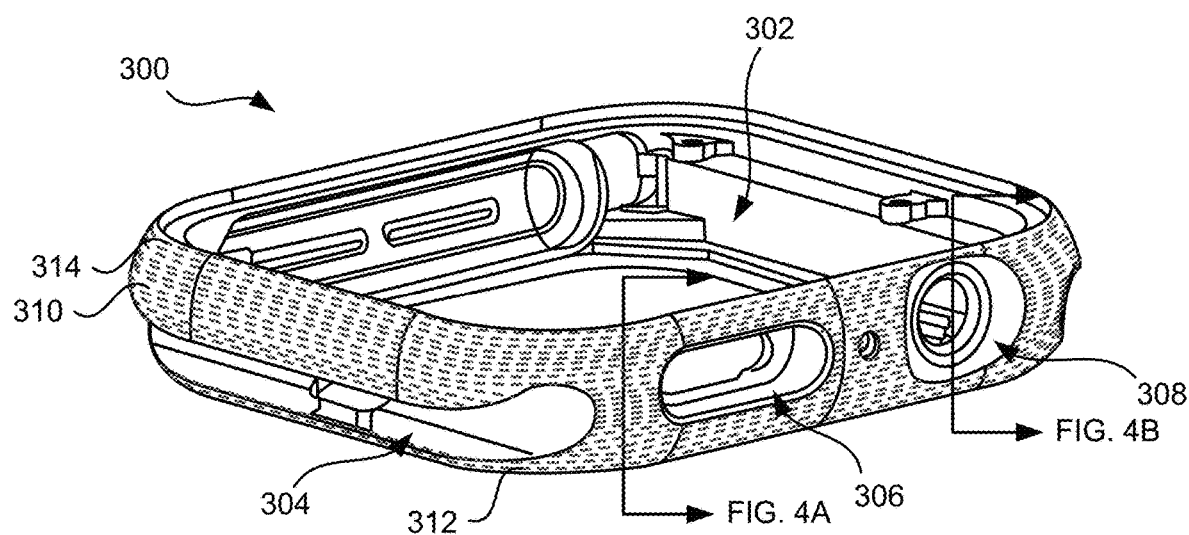
FIG. 3 is a perspective view of an exemplary wound housing, according to some embodiments of the present disclosure.

According to some embodiments, the windings of conductive and non-conductive filament can be adhered together to form a single, unitary structure. The unitary structure can then function as a housing to protect internal components of a portable electronic device. FIG. 3 is a perspective view of such an exemplary wound housing 300, according to some embodiments of the present disclosure. Wound housing 300 can be a unitary structure having a perimeter in the shape of a rounded rectangle, or any other suitable shape such as a circle, oval, square, hexagon, and the like. In some embodiments, the way the windings are arranged can give wound housing 300 a unidirectional grain-like appearance, as shown by the dotted lines in FIG. 3. The unidirectional grain-like appearance can give wound housing 300 a unique appearance of numerous ridges that extend around the perimeter of wound housing 300. The grain-like appearance defined by the wound filaments can be left exposed for the final product, or it can be coated with one or more layers of paint to hide the grain-like appearance.

As shown in FIG. 3, wound housing 300 can define an internal cavity 302 within which electrical components can be housed and protected. For instance, computing system 202, memory bank 204, user interface system 206, communication system 208, sensor system 210, and battery 212 discussed herein with respect to FIG. 2 can be separate components that are housed within internal cavity 302. The interior surface of wound housing 300 can be designed with indentations to better house the internal components, such as by providing cavities and/or ledges on which the internal components can mount. In some embodiments, wound housing 300 can include one or more openings 304, 306, and 308 positioned through, or partially into, its body where input devices, e.g., buttons, sensors, sockets, fastening mechanisms, and the like can be inserted. As an example, opening 304 can be an opening configured to receive a fastener of a watch strap to couple with wound housing 300, and openings 306 and 308 can be openings for buttons and/or watch dials. Some of the openings can be cavities that do not extend all the way into internal cavity 302. For instance, opening 304 can be a cavity within wound housing 300 that does not expose internal cavity 302, while openings 306 and 308 do expose internal cavity 302.

With the presence of openings 304, 306, and 308, some filaments of wound housing 300 are severed to form the openings, thereby resulting in some filaments winding around only a portion of the entire perimeter of wound housing 300, while other filaments wind around the entire perimeter. As an example, filament 310 is positioned close to the horizontal center of wound housing 300 where openings 306 and 308 are positioned. Accordingly, filament 310, as well as other filaments that are positioned in the same horizontal plane as openings 306 and 308 have portions of their winding removed such that filament 310 and the other filaments extend around only a portion of the perimeter of wound housing 300. Filaments that are not positioned in the same plane as any openings are able to extend around the entire perimeter of wound housing 300. For instance, filament 312 near the bottom of wound housing 300 and filament 314 near the top of wound housing 300, as well as any other filaments that do not reside in the same plane as openings 304, 306, and 308, can wind around the entire perimeter of wound housing 300. Those filaments that extend around the entire perimeter of wound housing 300 can be used to form one or more electronic components, such as an antenna or a charging component discussed herein with respect to FIG. 2. It is to be appreciated that although wound housing 300 shown in FIG. 3 only shows its outer surface, filament windings are also positioned through the entire cross-section of wound housing 300, as better shown in the cross-sectional views of certain points across wound housing 300 in FIGS. 4A and 4B.

Figures 4A, 4B:
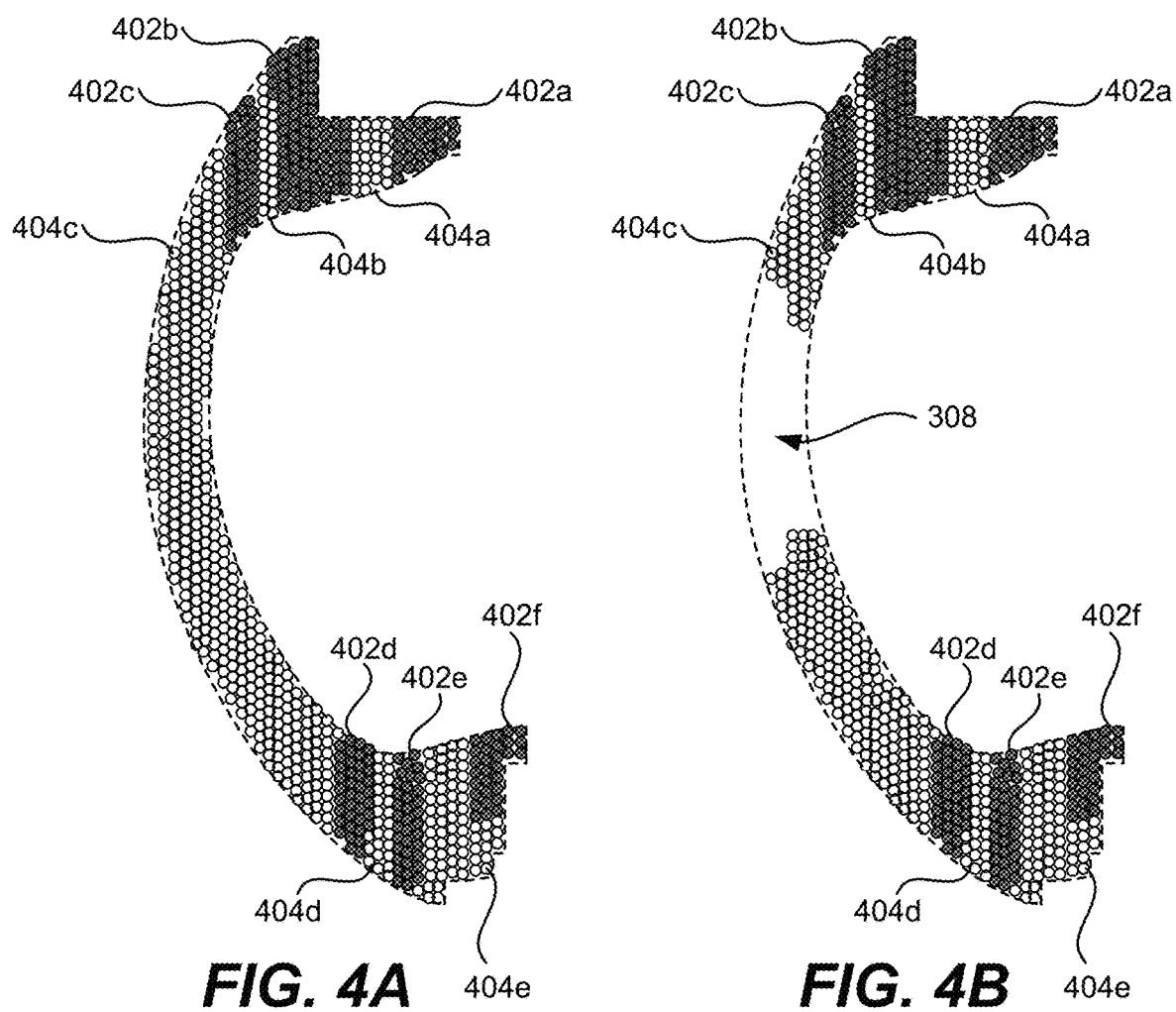
FIG. 4A is a cross-sectional view of a region of wound housing that does not include an opening, according to some embodiments of the present disclosure.
FIG. 4B is a cross-sectional view of a region of wound housing that includes an opening, according to some embodiments of the present disclosure.

FIGS. 4A-4B are cross-sectional views of different regions of an exemplary wound housing, e.g., wound housing 300 in FIG. 3, according to some embodiments of the present disclosure. Specifically, FIG. 4A is a cross-sectional view of a region of wound housing 300 that does not include an opening, and FIG. 4B is a cross-sectional view of a region of wound housing 300 that includes opening 308. As can be seen in FIGS. 4A-4B, the substantial construction of wound housing 300 is formed by windings of filament, where virtually none of the construction is formed by a solid monolithic part. The darker circles shown in FIGS. 4A-4B represent cross-sections of exemplary conductive filaments while the lighter circles represent cross-sections of non-conductive filaments. Each circle represents a turn of the respective filament.

With respect to FIG. 4A, wound housing 300 can include any number of windings of conductive and non-conductive filament, each winding of filament formed of several turns of filament. For instance, wound housing 300 can include windings of conductive filament 402a-f and windings of non-conductive filament 404a-e. One or more windings of conductive filament 402a-f and one or more windings of non-conductive filament can extend from the outer surface to the inner surface of wound housing 300. As an example, winding 402d can extend from the outer surface to the inner surface of wound housing 300, while winding 402f can extend from the inner surface of wound housing 300 to a depth within wound housing 300 such that winding 402f does not extend all the way through to the outer surface of wound housing 300. By not extending all the way through, winding 402f may not be exposed on the outer surface of housing 300, and thus may not be seen when wound housing 300 is utilized in a portable electronic device. This can be more aesthetically pleasing to a user.

Each winding of conductive filament can be physically separated and/or electrically isolated from one another by a winding of non-conductive filament. As an example, windings of conductive filament 402c and 402d can be physically separated and electrically isolated from each other by winding of non-conductive filament 404c. In some embodiments, windings of conductive filament can be physically separated by a winding of non-conductive filament yet still be electrically coupled together. For instance, windings of conductive filament 402c and 402d can be physically separated by winding of non-conductive filament 404c, but winding 402c can have its filament extend to winding 402d, and even be used to form winding 402d in some embodiments. In these instances, windings 402c and 402d can be formed of a single filament that first winds tightly to form winding 402c, then winds loosely down across the space between windings 402c and 402d, and then winds tightly again to form winding 402d.

The number of turns for each winding of conductive filament can dictate the size of the winding, where larger number of turns results in larger windings and vice versa. The size of the winding can be tailored to construct an electrical component with certain desired properties. For instance, larger-sized windings can result in larger conductive bodies that can form a stronger antenna. Additionally, larger-sized windings can result in larger number of turns of conductive filament, which can result in an inductive coil that can generate larger magnitudes of magnetic flux or can more strongly interact with magnetic flux generated by an external device configured as a wireless charger (see FIG. 2 and related description).

In some embodiments, windings of conductive filament 402a-f can be positioned in regions of wound housing 300 that are not coplanar with an opening so that the conductive filament is not severed when the openings are formed. For instance, windings 402a-f are positioned near the top and bottom regions of wound housing 300, as shown in FIGS. 4A and 4B. This may be especially true for embodiments where the winding of conductive filament is used to form an inductive coil. In these embodiments, each turn of wire cannot be severed or else the inductive coil would not work. This is because as an inductive coil, each turn is electrically coupled through a core and the surface of the core in each turn are electrically isolated from surfaces of adjacent cores so that current can propagate along the length of the core from an input end to an output end. If the winding is cut, then the core is severed and the input end of the inductive coil is disconnected from the output end of the inductive coil.

This concept can be better understood with reference to FIGS. 5A and 5B, which illustrate top-down and cross-sectional views of a winding of conductive filament configured as an inductive coil. Specifically, FIG. 5A is a top-down view 500 of an exemplary winding of conductive filament 504 configured as an inductive coil, and FIG. 5B is a cross-sectional view of a portion 506 of winding of conductive filament 504 used to form the inductive coil, according to some embodiments of the present disclosure.

As shown in FIG. 5A, winding of conductive filament 504 can wind along the entire perimeter of the wound housing to define an internal cavity 502. The surface of each turn of the winding is electrically insulated from adjacent turns, but the core is coupled together along the length of the winding to form an inductive coil. This is enabled by a conductive filament that has a conductive core 508 surrounded by an insulating sleeve 510, as can be seen in FIG. 5B showing four turns of conductive filament 504. Each turn of conductive filament 504 can be electrically coupled together through their conductive cores, but electrically isolated across their outer cylindrical surfaces. For instance, core 508 can be electrically coupled to cores 512 and 514 of adjacent turns along the length of core 508 of winding 504, but insulating sleeve 510 prevents adjacent turns from being electrically coupled together through their outer surfaces. The resulting spiraling nature of winding of conductive filament 504 results in the formation of an inductive coil that can transmit and receive wireless power through the generation of and interaction with magnetic flux. If winding of conductive filament 504 is severed by an opening 501, e.g., the bottom right turn is removed, then the turns may not be coupled together as the electrical connection through their cores are severed and the inductive coil may not function properly.

Conductive filament constructed with a conductive core surrounded by an insulating sleeve can be formed of different types of materials. The conductive core can be formed of a conductive metal (e.g., copper), and the insulating sleeve can be formed of a non-conductive reinforced polymer, such as glass-reinforced epoxy, glass-reinforced thermoplastic (e.g. nylon), and the like.

However, in other embodiments where a winding of conductive filament is configured as a conductive body, such as an antenna, it may not be detrimental to the functionality of the electrical component to be positioned coplanar with an opening, e.g., opening 308 shown in FIG. 4B, such that the opening cuts through the winding. This is because as a conductive body, each adjacent turn of conductive filament has outer surfaces that are electrically coupled to one another, and thus an electrical path through the core is not required to exist. The conductive body can still function even though the cores are electrically isolated from one another. A better understanding of this concept can be achieved with reference to FIGS. 6A-6C.

FIGS. 6A-6C illustrate top-down and cross-sectional views of a winding of conductive filament configured as a conductive body, according to some embodiments of the present disclosure. Specifically, FIG. 6A is a top-down view 600 of an exemplary winding of conductive filament 604 configured as a conductive body, FIG. 6B is a cross-sectional view of a portion 606 of winding of conductive filament 604 used to form the conductive body that is constructed with a solid conductive filament, and FIG. 6C is a cross-sectional view of an exemplary portion 607 of another exemplary winding of conductive filament 604 used to form the conductive body that is constructed with a filament including a core coated with a conductive plating, according to some embodiments of the present disclosure.

Like winding 504, winding 604 can wind along the entire perimeter of the wound housing to define an internal cavity 602. However, contrary to winding 504, the outer surface of each turn of winding 604 is electrically coupled to outer surfaces of adjacent turns. This can be enabled by a conductive filament that has a conductive outer surface that is not insulated from adjacent turns. The conductive filament can be constructed as a solid conductive filament having a conductive, monolithic structure as shown in FIG. 6B, or a conductive filament having a core 611 coated by a conductive plating 609, as shown in FIG. 6C. Accordingly, each turn of conductive filament 604 can be electrically coupled together through their outer conductive surface.

For instance, all four turns of winding 604 shown in the embodiment of FIG. 6B can be electrically coupled together through the outer surfaces of the solid conductive filament at interfaces 605a-d. Similarly, all four turns of winding 604 shown in the embodiment of FIG. 6C can be electrically coupled together through the outer surfaces of conductive plating 609 at interfaces 612a-d. By being electrically coupled through the outer surfaces of each turn of conductive filament, winding of conductive filament 604 as a whole can electrically function as a single conductive body. And as a single conductive body, winding of conductive filament 604 can still operate as a conductive body even when one or more turns are removed due to one or more openings, e.g., opening 601, in the wound housing. For example, if the bottom right turn of winding 604 in FIG. 6B is removed, the remaining three turns can be coupled together through interfaces 605a-c and maintain the functionality of a conductive body. Likewise, if the bottom right turn of winding 604 in FIG. 6B is removed, the remaining three turns can be coupled together through interfaces 612a-c.

Such conductive filament having a core coated with a conductive plating can be formed of different types of materials. The core can be formed of any suitable semi-conductive or non-conductive materials that can be stretched for form long strands of filament such as carbon fiber, and the conductive plating can be formed of any suitable conductive material such as copper, silver, nickel, and the like. The conductive plating can be deposited onto the core and have a conductivity that is higher than a conductivity of the core. Conductive filaments formed of a solid conductive filament can be formed of highly conductive materials such as copper. Each type of conductive filament can have their own unique benefits and cost effectiveness that can dictate how they are used in a design. For example, solid conductive filaments have higher conductivity and less resistance, thereby enabling a winding to achieve electrical characteristics that are similar to that of an actual solid conductive body. However, utilizing these types of filaments can be more expensive than perhaps the conductive filaments constructed with a conductive plating coating a core. Using the conductive filaments having the conductive plating coated on a core can ease manufacturing costs at the expense of conductivity. It is to be appreciated that any combination of these types of conductive filaments can be used in a wound housing to achieve the desired functionality and that embodiments herein are not limited to any specific arrangement of conductive filaments in a wound housing.

Although FIGS. 5B, 6B and 6C illustrate each turn of a winding of conductive filament as being formed of a single conductive filament, embodiments are not limited to such configurations. Other embodiments can have each turn formed of several filaments to form a stranded filament. Accordingly, each turn of FIGS. 5B, 6B, and 6C can be formed of several filaments instead of a single filament as shown. The same can be said for non-conductive filaments, where each turn of a winding of non-conductive filament is formed of stranded non-conductive filaments. Furthermore, the diameter of the filaments used to form the wound housing can vary depending on how bendable the filaments need to be. Wound housings having more rounded edges may not need filaments that bend as much as filaments for wound housings having sharper edges. Smaller diameters in many cases result in greater bendability. Furthermore, the strain-to-failure of the materials used can also dictate how thin the filament needs to be. Thus, for instance, some suitable diameters for an exemplary filament containing a carbon fiber core, which has a strain-to-failure of 2.2%, can range between 5 to 10 microns, particularly approximately 7 microns in diameter. In another example, an exemplary filament containing a glass core, which has a strain-to-failure of 4% to 5.7%, can range between 4-30 microns, such as approximately 10 microns in diameter.

Figure 7:
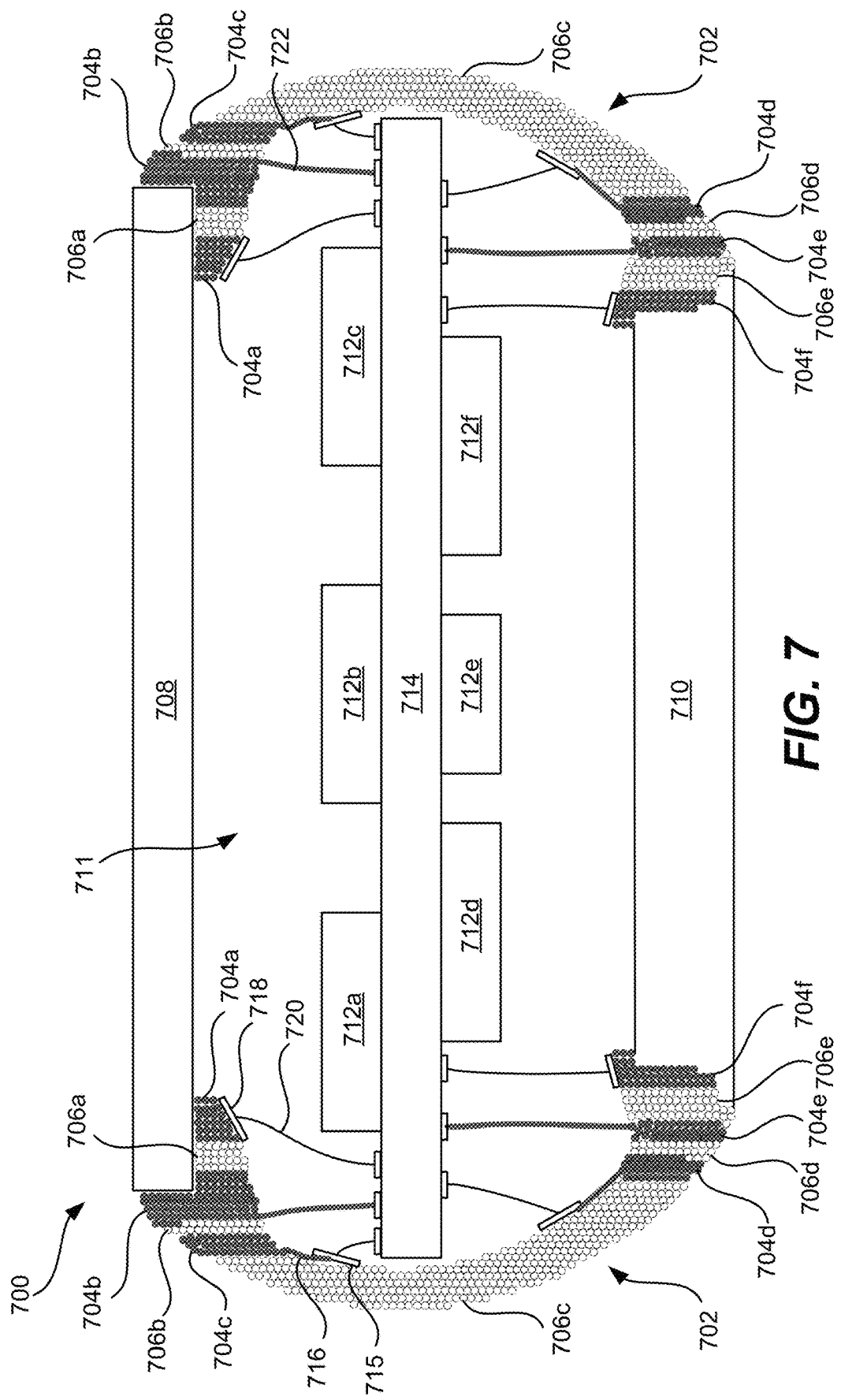
FIG. 7 is a cross-sectional view of an exemplary portable electronic device having a wound housing, according to some embodiments of the present disclosure.

In order to operate the windings of conductive filament in the wound housing, one or more internal components of the portable electronic device can be coupled to the windings, as will be discussed further herein. FIG. 7 is a cross-sectional view of an exemplary portable electronic device 700 having a wound housing 702, according to some embodiments of the present disclosure. Wound housing 702 can be formed with several windings of conductive filament 704a-f and several windings of non-conductive filament 706a-e that physically and/or electrically separate windings of conductive filament 704a-f from one another. In some embodiments, one or more components 708 and 710 can be attached to wound housing 702 to fully enclose and seal internal cavity 711 from the environment. For instance, component 708 can be a display that is coupled to the top of wound housing 702, and component 710 can be a plate of glass embedded or coated with one or more sensors and coupled to the bottom of wound housing 702. Although FIG. 7 shows components 708 and 710 as being attached to wound housing 702 to fully enclose internal cavity 711, embodiments are not so limited. Other embodiments may have more or less components for fully enclosing internal cavity 711, such as no components, one component, or three or more components.

In some embodiments, a plurality of internal components can be housed within wound housing 702. For instance, internal components 712a-f can be attached to an interconnection board 714 (e.g., a printed circuit board (PCB), flex circuit, and the like) and positioned within internal cavity 711 of wound housing 702. Internal components 712a-f can be various electrical components for enabling the operation of portable electronic device, as well as enabling the functionality of wound housing 702. As an example, internal components 712a-f can include integrated circuits, processors, semiconductor chips, electrochemical devices, and the like for functioning as a computing system, memory bank, user interface system, communication system, sensor system, and a battery, as discussed herein with respect to FIG. 2. The computing system and battery can be coupled to a winding of conductive filament in wound housing 702 and configured as an inductive coil so that the winding can operate as a charging component for wirelessly transferring power out of the battery to charge an external device (not shown) and wirelessly receive power from the external device to charge the battery. Likewise, the communication system can be coupled to a winding of conductive filament in wound housing 702 and configured as a conductive body so that the winding can operate as an antenna for sending radio wave signals out to, and receive radio wave signals from, a cell tower (not shown).

Wound housing 702 can be configured various ways to enable internal components 712a-f to be coupled to windings of conductive filament 704a-f. For instance, wound housing 702 can include a contact structure 715 positioned on an inner surface of wound housing 702. Contact structure 715 can be formed of a plate of conductive material capable of making an electrical connection with an electrical component through a conductive trace or any other suitable connection method. Contact structure 715 can be electrically coupled to its respective winding of conductive filament 704c via a conductive trace 716. In some embodiments, conductive trace 716 can be part of a conductive filament of winding 704c that extends along the inner surface and away from winding 704c toward contact structure 715. Thus, an internal component can couple with winding 704c by connecting with contact structure 715. This type of connection may be particularly useful for instances where winding 704c is configured as an inductive coil so that the internal component can connect directly to the input and output of winding 704c.

Rather than routing part of the conductive filament away from the winding, the contact structure can be placed directly against the respective winding in other embodiments. As an example, contact structure 718 can be positioned directly against winding 704a to make contact with winding 704a. Thus, an internal component can couple with winding 704a by connecting with contact structure 718. This type of connection may be particularly useful for instances where winding 704a is configured as a conductive body so that the internal component can connect directly to conductive surfaces of several turns of winding 704a.

In some alternative and additional embodiments, wound housing 702 may not need to include a contact structure for coupling its windings to the internal components. Instead, the winding itself can have a part that extends directly toward interconnection board 714. For example, winding 704b can have a part 722 that extends away from winding 704b and away from the inner surface of wound housing 702 toward interconnection board 714. That way, winding 704b itself (and thus wound housing 702 by extension) can make direct contact with interconnection board 714 without the need for a separate contact structure to be positioned against wound housing 702. In another example, a winding can be exposed at the inner surface of wound housing 702 so that the internal component can make direct contact with exposed conductive surfaces of the winding.

It is to be appreciated that any suitable printed circuit board (PCB) fabrication methods for connecting devices to the windings can be utilized in embodiments of the present disclosure. For instance, copper traces can be formed on the inner surface of the housing by plating copper and then masking and etching the plated copper to form the copper traces. The housing can then be drilled from the inner surface to expose a portion of a conductive winding. The portion of the exposed conductive winding can then be coupled with the copper trace by another step of conductive plating. In another instance, conductive pins can be embedded within the wound housing at a position that couples with a conductive winding so that devices can couple to the pins to couple with the respective conductive winding. And in additional examples, electrical components can be directly mounted onto the inner surface of the housing to couple with one or more wound housings.

III. Method of Forming a Wound Housing

Figure 8:
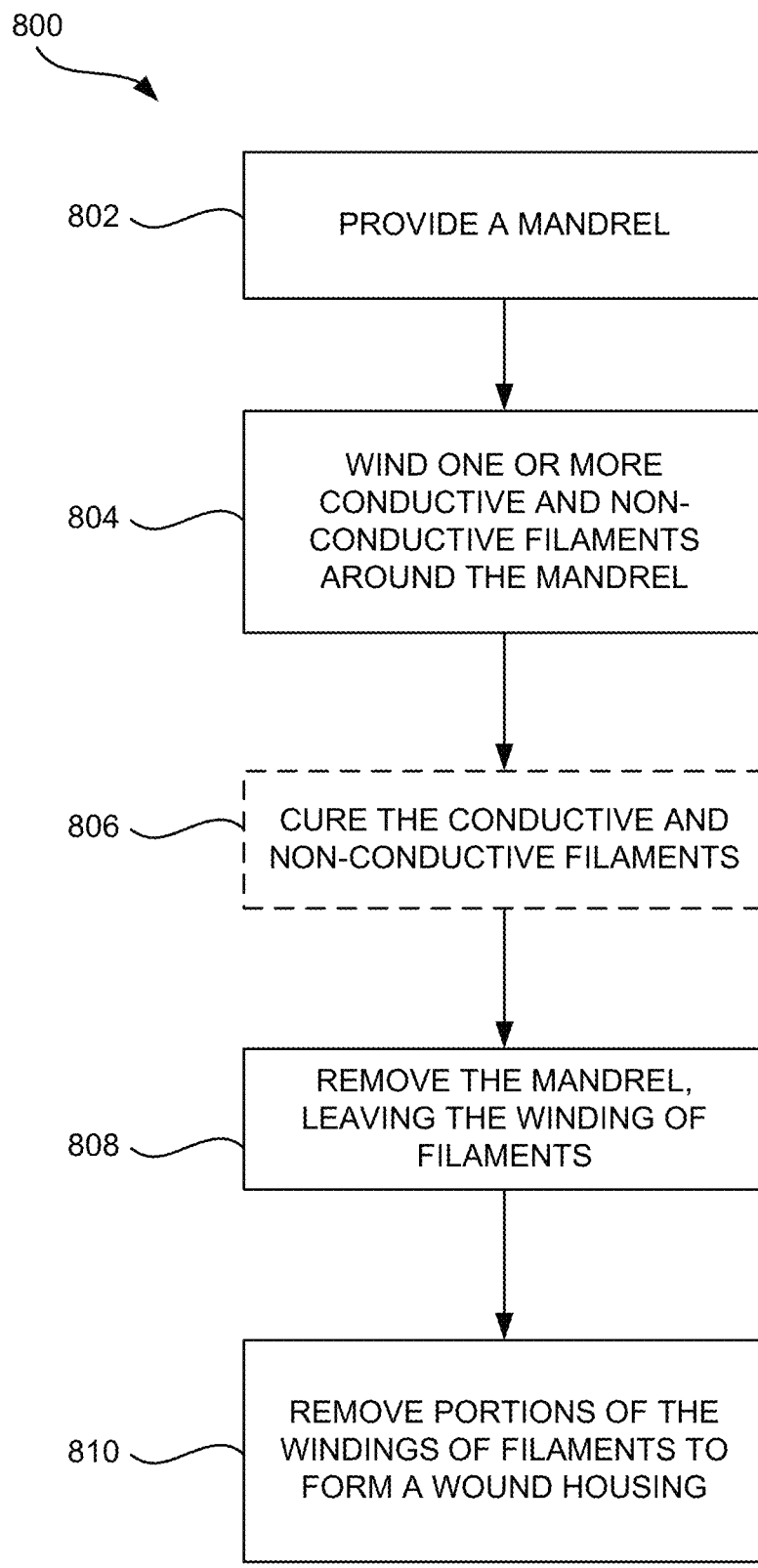
FIG. 8 is a flow chart illustrating an exemplary method of forming a wound housing, according to some embodiments of the present disclosure.

FIG. 8 is a flow chart illustrating an exemplary method 800 of forming a wound housing, according to some embodiments of the present disclosure. It is to be appreciated that FIGS. 9-14 will be referenced during the discussion of FIG. 8 to better illustrate method 800 of forming a wound housing.

At block 802, a mandrel is provided. A mandrel can be a structure that has a specific shape and surface contours around which a wound housing can be formed. FIGS. 9A and 9B are simplified diagrams of an exemplary mandrel for forming a wound housing, according to some embodiments of the present disclosure. Specifically, FIG. 9A is a cross-sectional view of an exemplary mandrel 900, and FIG. 9B is a top-down view of mandrel 900. Mandrel 900 can be a structure that has side surfaces 902 (see FIG. 9A) that extend around the entire perimeter of mandrel 900 shaped as a rounded rectangle (see FIG. 9B). Side surfaces 902 shown in FIG. 9A can include various surface contours designed to be a reversed version of what is intended to be formed for the wound housing, similar to a negative for camera film. Thus, when windings are wound around mandrel 900, the inner surface of the wound structure results in surface contours that follow side surfaces 902, as will be discussed further herein.

In some embodiments, mandrel 900 can be deformable so that mandrel 900 can be removed to leave the windings formed around mandrel 900 intact. For example, mandrel 900 can be configured to be deconstructed so that it can come apart upon the release of a locking mechanism. Or, mandrel 900 can be configured to dissolve in water. In this case, mandrel 900 can be formed of a water-soluble polymer. In another case, mandrel 900 can be configured to be disassembled so that it can be removed by releasing a part of the mandrel.

With reference back to FIG. 8, at block 804, one or more conductive and non-conductive filaments can wind around the mandrel. The one or more filaments can wind around the mandrel in a way that results in the filament arrangement shown in FIG. 4A so that one or more windings of conductive filament can form electrical components within the wound housing separated by one or more windings of non-conductive filament, according to some embodiments of the present disclosure. FIG. 10 is a simplified diagram illustrating an exemplary system 1000 for winding one or more conductive and non-conductive filaments around mandrel 900. A spool of non-conductive filament 1002 and spools of conductive filament 1004 and 1006 in system 1000 can unwind their respective filaments through a bath 1008, such as a resin bath, to coat the filaments with an adhesive, such as a matrix resin like epoxy prepreg. Once the filaments run through bath 1008, the coated filaments can pass through respective holes in a wire guide 1010, which maintain separation of the filaments to avoid tangling. Then, the filaments can be wound about mandrel 900 as mandrel 900 rotates around its central axis.

In some embodiments, each filament from spools 1002, 1004, and 1006 can be selectively wound around mandrel 900. For instance, non-conductive filament from spool 1002 can first be wound around mandrel 900 a certain number of times. Then, non-conductive filament from spool 1002 can be cut, and the next filament can be wound around mandrel 900, such as conductive filament from spool 1004. This process can be repeated with different filaments and in different orders until the final winding around mandrel 900 has the targeted winding arrangement, such as that shown in FIG. 4A. It is to be appreciated, however, that this is merely one embodiment by which the filaments can be wound to form a wound housing, and that any suitable method can be used to form the wound housing. For instance, another way could be to wind a non-conductive filament around mandrel 900 while selectively coating certain lengths of the non-conductive filament with conductive material as it is being wound to form the windings of conductive filament. Thus, the non-conductive filament may not need to be cut each time a winding of conductive filament is to be formed, thereby saving manufacturing time and cost. Additionally, another way would be to use fibers pre-impregnated with partially cured resin, e.g., prepreg or towpreg, so that a wet resin bath is not needed as shown in FIG. 10. Furthermore, another way would be to utilize resin infusion or the resin transfer molding (RTM) process where dry fibers are wound around the mandrel, then an external tool is assembled over the mandrel and wound fibers to define the outer surface of the housing, and finally resin is injected into the resulting cavity between the external tool and the mandrel. Yet further, another way would be to utilize a thermoplastic matrix composite that can be heated and melted and consolidated as they are wound so no additional processing or curing is required.

FIG. 11 is a simplified diagram illustrating mandrel 900 after several windings of conductive and non-conductive filaments have wound around it. As can be seen in FIG. 11, side surfaces of mandrel 900 can be covered by windings of filaments 1100, and the windings can have an inner surface contour that reflects the contours of side surfaces 902 of mandrel 900.

With reference back to FIG. 8, at block 806, an optional curing process can be performed to cure the conductive and non-conductive filaments while the windings are still positioned around mandrel 900 to fix the windings in place. Once the curing process is completed, the windings may be fixed to each other and hardened such that they have the structural integrity sufficient to protect internal components of a portable electronic device.

Figure 12:
FIG. 12 is a simplified diagram illustrating a cross-sectional view of windings of filaments after the mandrel shown in FIG. 11 has been removed for forming a wound housing, according to some embodiments of the present disclosure.

At block 808, the mandrel can then be removed, leaving the winding of filaments to exist as a structure on their own. The mandrel can be removed in various ways, such as being deconstructed, dissolved, or disassembled, depending on the way it is designed, as aforementioned herein with respect to FIGS. 9A and 9B. FIG. 12 is a simplified diagram illustrating a cross-sectional view of windings of filaments 1100 after mandrel 900 has been removed, according to some embodiments of the present disclosure. Once mandrel 900 is removed, windings of filaments 1100 can have inner surface contours 1200 that reflect side surfaces 902 of mandrel 900.

Figure 13:
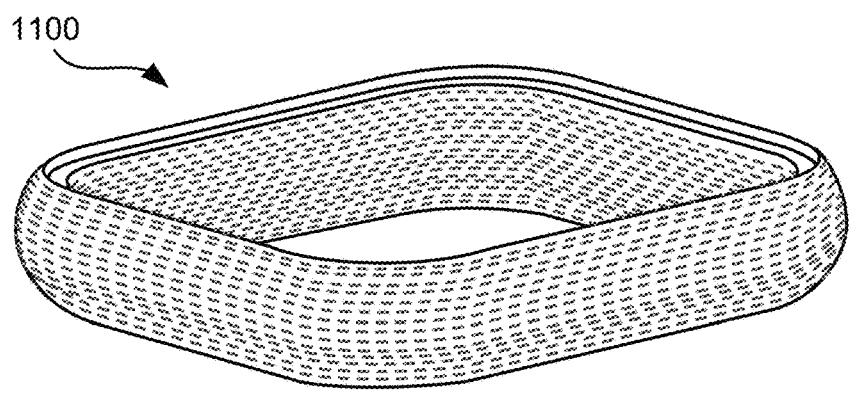
FIG. 13 is a simplified diagram of a perspective view of windings of filaments after the mandrel shown in FIG. 11 has been removed for forming a wound housing, according to some embodiments of the present disclosure.

Another view of windings of filaments 1100 can be seen in FIG. 13. FIG. 13 is a simplified diagram of a perspective view of windings of filaments 1100 after mandrel 900 has been removed, according to some embodiments of the present disclosure. The structure of windings of filaments 1100 can result in a unidirectional grain-like appearance on the surfaces of windings 1100 that can be seen or hidden in the final construction of the wound housing.

Figure 14:
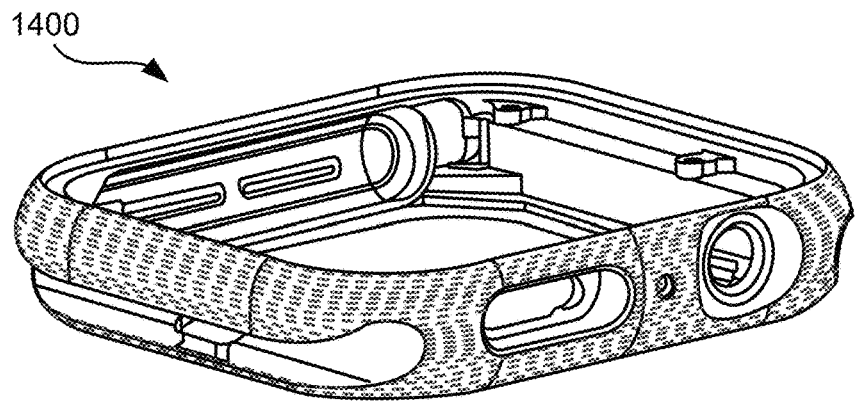
FIG. 14 is a perspective view of a simplified diagram illustrating an exemplary wound housing after portions are removed from the windings of filaments shown in FIG. 13, according to some embodiments of the present disclosure

With reference back to FIG. 8, at block 810, portions of windings of filaments can be removed to form a wound housing. For instance, parts of a winding of non-conductive filament can be removed to form one or more openings within which buttons, mechanical fasteners, sensors, and the like can be positioned, as discussed herein with respect to FIG. 3. Additionally, portions of the inner surface of windings of filament can be removed to form contours for housing internal components when the wound housing is incorporated into a portable electronic device. Portions of the windings can be removed by any suitable process, such as by CNC machining. FIG. 14 is a perspective view of a simplified diagram illustrating an exemplary wound housing 1400 after portions are removed from the windings of filaments, according to some embodiments of the present disclosure. Wound housing 1400 can be substantially similar to wound housing 300 discussed herein with respect to FIG. 3.

As a result of method 800, a wound housing can be constructed. The resulting wound housing can be formed of one or more windings of conductive and non-conductive filament. The windings of conductive filament can give the wound housing more than just protective functionality for internal components of a portable electronic device. For instance, the windings of conductive filament can enable the wound housing to operate as an inductor coil that can generate and interact with magnetic flux, and/or to operate as an antenna that can send and receive signals through radio waves. By providing additional functionality, the wound housing can eliminate the need for certain internal electrical components, thereby allowing the portable electronic device to be made smaller or enabling the portable electronic device to provide even more functionality.

Although the invention has been described with respect to specific embodiments, it will be appreciated that the invention is intended to cover all modifications and equivalents within the scope of the following claims.

What is claimed is:

1. A housing for an electronic device, comprising:
   a non-conductive filament wound around at least a first portion of a perimeter of the housing; and
   a conductive filament wound around a least a second portion of the perimeter of the housing, the non-conductive filament and the conductive filament being adhered together to form the housing.

2. The housing of claim 1, wherein the conductive filament forms an inductive coil configured to generate magnetic flux to wirelessly charge an external device or interact with magnetic flux to generate a current through the conductive filament.

3. The housing of claim 2, wherein the conductive filament comprises a conductive core and a non-conductive sleeve that electrically insulates conductive cores of adjacent turns from one another in the conductive filament.

4. The housing of claim 1, wherein the conductive filament forms a single conductive body configured to generate and receive radio waves.

5. The housing of claim 4, wherein the conductive filament comprises a solid conductive wire.

6. The housing of claim 4, wherein the conductive filament comprises a core surrounded by a conductive plating.

7. The housing of claim 1, wherein the conductive filament is directly adhered to the non-conductive filament.

8. The housing of claim 1, wherein the non-conductive filament forms a winding that extends from an outer surface to an inner surface of the housing.

9. The housing of claim 1, wherein the conductive filament forms a winding that extends from an outer surface to an inner surface of the housing.

10. The housing of claim 1, wherein the conductive filament is a first conductive filament and the housing further comprises a second conductive filament wound around at least a third portion of the perimeter of the housing and adhered together with the first conductive filament and the non-conductive filament to form the housing.

11. The housing of claim 10, wherein the first conductive filament and second conductive filament are electrically isolated from one another by the non-conductive filament.

12. The housing of claim 1, further comprising a contact structure electrically coupled to the conductive filament and positioned on an inner surface of the housing, the contact structure formed of a plate of conductive material configured to make an electrical connection with an electrical component.

13. The housing of claim 12, wherein the contact structure is directly attached to the conductive filament or coupled to the conductive filament through a conductive trace.

14. The housing of claim 1, wherein the conductive filament extends into the housing past an inner surface to couple with an electronic component inside the housing.

15. A portable electronic device comprising:
    a housing defining an interior cavity and formed from a plurality of filaments wound around a perimeter of the housing and adhered together to form the housing, the plurality of filaments including at least one non-conductive filament and at least one conductive filament that forms a first electronic component of the portable electronic device; and
    a second electronic component disposed within the interior cavity of the housing and electrically coupled to the first electronic component.

16. The portable electronic device of claim 15, wherein the second electronic component is coupled to the first electronic component through a contact structure positioned on an inner surface of the housing.

17. The portable electronic device of claim 15 wherein at least some of the plurality of filaments have a diameter between 4-30 mircons.

18. The portable electronic device of claim 15 further comprising a circuit board disposed within the interior cavity and wherein the second electronic component is one of a plurality of electronic components coupled to the circuit board and disposed within the interior cavity.

19. The portable electronic device of claim 15 wherein the plurality of filaments form a sidewall of the housing surrounding the interior cavity and the housing includes one or more openings formed through the sidewall.

20. The portable electronic device of claim 19 wherein the plurality of filaments are wound around the housing such that some windings of the plurality of filaments extend fully around the perimeter and other windings of the filaments are severed at the one or more openings.

21. The portable electronic device of claim 15 further comprising one or more components coupled to the housing to seal the interior cavity from the environment, wherein the one or more components includes a display.

22. The portable electronic device of claim 21 wherein the plurality of filaments of the housing define a shelf surrounding an opening in the housing and the display is coupled to the housing at the shelf.

23. An electronic device, comprising:
    an interconnection board comprising at least one contact structure;
    at least one electrical component mounted on the interconnection board and electrically coupled to the at least one contact structure; and
    a housing surrounding the interconnection board and the at least one electrical component, the housing comprising:

a non-conductive filament wound around at least a first portion of a perimeter of the housing; and a conductive filament wound around at least a second portion of the perimeter of the housing, the non-conductive filament and the conductive filament are adhered together to form the housing.

24. The electronic device of claim 23, wherein the conductive filament is electrically coupled to an electrical component of the at least one electrical component.

25. The electronic device of claim 23, wherein the conductive filament forms an inductive coil configured to generate magnetic flux to wirelessly charge an external device or interact with magnetic flux to generate a current through the conductive filament.

26. The electronic device of claim 23, wherein the conductive filament forms a single conductive body configured to generate and receive radio waves.

\* \* \* \* \*

UNITED STATES PATENT AND TRADEMARK OFFICE
CERTIFICATE OF CORRECTION

PATENT NO.         : 10,840,739 B2
APPLICATION NO.    : 15/990455
DATED              : November 17, 2020
INVENTOR(S)        : Scott W. Slabaugh et al.

It is certified that error appears in the above-identified patent and that said Letters Patent is hereby corrected as shown below:

On the Title Page

Item [57] should read:
Embodiments describe a housing for an electronic device that includes a non-conductive filament wound around at least a first portion of a perimeter of the housing, and a conductive filament wound around at least a second portion of the perimeter of the housing. The non-conductive filament and the conductive filament are adhered together to form the housing.

In the Claims

Claim 1, Column 15, Line 36 delete "wound around a least a second" and insert --wound around at least a second--

Claim 11, Column 16, Line 4 delete "filament and second conductive" and insert --filament and the second conductive--

Signed and Sealed this
Second Day of March, 2021

Drew Hirshfeld
*Performing the Functions and Duties of the
Under Secretary of Commerce for Intellectual Property and
Director of the United States Patent and Trademark Office*